(12) United States Patent
Jang

(10) Patent No.: US 6,801,067 B2
(45) Date of Patent: Oct. 5, 2004

(54) ANALOG SYNCHRONOUS MIRROR DELAY CIRCUIT, METHOD OF GENERATING A CLOCK AND INTERNAL CLOCK GENERATOR USING THE SAME

(75) Inventor: Seong-Jin Jang, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/404,102

(22) Filed: Apr. 2, 2003

(65) Prior Publication Data

US 2003/0227309 A1 Dec. 11, 2003

(30) Foreign Application Priority Data

Jun. 11, 2002 (KR) .................................. 10-2002-0032599

(51) Int. Cl.[7] .............................................. H03H 11/26
(52) U.S. Cl. ...................................... 327/161; 327/280
(58) Field of Search ................................ 327/141, 161, 327/272, 274, 276, 281, 285, 287, 288, 299, 280

(56) References Cited

U.S. PATENT DOCUMENTS 6,377,093 B1 * 4/2002 Lee et al. .................... 327/161
6,437,613 B2 * 8/2002 Shim et al. .................. 327/141

* cited by examiner

*Primary Examiner*—Linh M. Nguyen
(74) *Attorney, Agent, or Firm*—Harness Dickey

(57) ABSTRACT

A method of generating a clock may use an analog synchronous mirror delay (ASMD) circuit with a duty cycle correction scheme, and an internal clock generator may use one or more of the ASMD circuits, The ASMD circuit may include a comparator with first and second input terminals that generates an output clock based on a comparison result between a signal on the first input terminal and a signal on the second input terminal, a first precharge circuit connected to the first input terminal and precharging the first input terminal, and a second precharge circuit connected to the second input terminal and precharging the second input terminal. The ASMD circuit may also include a first pair of discharge circuits discharging the first input terminal within first and second cycles of the input clock, and a second pair of discharge circuits discharging the second input terminal within first and second cycles of the input clock.

33 Claims, 3 Drawing Sheets

ANALOG SYNCHRONOUS MIRROR DELAY CIRCUIT, METHOD OF GENERATING A CLOCK AND INTERNAL CLOCK GENERATOR USING THE SAME

CROSS-REFERENCE TO RELATED CASES

This U.S. nonprovisional patent application claims priority under 35 U.S.C. §119 of Korean Patent Application 2002-32599, filed on Jun. 11, 2002, the entire contents of which are hereby incorporated by reference.

BACKGROUND OF THE INVENTION

1. Field of the Invention

The present invention relates to an analog synchronous mirror delay (ASMD) circuit, a method of generating a clock and an internal clock generator using the same.

2. Description of the Related Art

As the demand for a high-speed system increases, absence of skew between data and a system clock is more significant for exact transmissions of data. For example, a nonvolatile memory such as a synchronous dynamic random access memory (SDRAM) may typically include a clock generating circuit for generating an internal clock signal synchronizing with an external clock signal. Since many operations of an SDRAM including data input/output are with reference to the internal clock signal, the clock signal generating circuit which generates the internal clock signal is a more significant circuit to a SDRAM.

To substantially reduce the skew, internal clock generators, such as phase-locked loops (PLLs) and delay-locked loops (DLLs), are generally used. A phase-locked loop (PLL) or a delay-locked loop (DLL) is used to synchronize an internal clock signal with an external clock signal. For example, a PLL or DLL may use a feedback circuit within a SDRAM to generate an internal clock signal which derives from, and synchronizes with, an external clock signal.

The PLLs and DLLs have duty cycle correction schemes that may require several hundreds of clock cycles for locking. Further, the PLLs and the DLLs must be very precisely designed to properly operate regardless of variations in process, voltage, and temperature (PVT).

For synchronous DRAMs (SDRAMs) and dual data rate (DDR) SDRAMs, methods and/or circuits employing a synchronous mirror delay (SMD), an analog synchronous mirror delay (ASMD), and a single way pumping SMD have recently been developed, in an effort to synchronize an internal clock signal with an external clock signal. These delay circuits require two-clock cycles for locking. A duty cycle correction scheme is substantially significant in a dual edge triggering system, such as DDR synchronous DRAM; however, current SMD and ASMD circuits or methods, or clock generation circuits or methods including SMD or ASMD circuits, for example, do not include a duty cycle correction scheme.

SUMMARY OF THE INVENTION

Exemplary embodiments of the present invention provide an analog synchronous mirror delay (ASMD) with a two-clock cycle for locking and a duty cycle correction scheme, a method of generating a clock in ASMD that runs a duty cycle correction scheme and has a two-clock cycle for locking, and an internal clock generator using the analog synchronous mirror delay.

An exemplary embodiment of the present invention is directed to an analog synchronous mirror delay (ASMD) that may include a comparator with first and second input terminals that generates an output clock based on a comparison result between a signal on the first input terminal and a signal on the second input terminal, a first precharge circuit connected to the first input terminal and precharging the first input terminal and a second precharge circuit connected to the second input terminal and precharging the second input terminal. Additionally, the ASMD circuit may include a first discharge circuit discharging the first input terminal for a given period within a first cycle of an input clock, a first additional discharge circuit discharging the first input terminal for a first logic-state period of the input clock within first and second cycles of the input clock, a second discharge circuit discharging the second input terminal for the second cycle of the input clock, and a second additional discharge circuit discharging the second input terminal for a second logic-state period of the input clock within the first and second cycles of the input clock.

Another exemplary embodiment of the present invention is directed to a method of generating a clock that may include precharging a first node and a second node, discharging the first node for a given period of time within a first cycle of an input clock, discharging the first node for a given first logic-state period of the input clock, discharging the second node for a second cycle of the input clock, and discharging the second node for a given second logic-state period of the input clock. A signal output from the first node may be compared to a signal output from the second node, with an output clock being output based on a result of the comparison.

Another exemplary embodiment of the present invention is directed to an internal clock generator. The internal clock generator may include an input buffer buffering an external clock, an inverter inverting a signal output from the input buffer, and a plurality of ASMD circuits for generating clocks at different times, and an edge detector outputting an internal clock that rises at rising edges of certain clocks generated by the ASMD circuits and falls at rising edges of other certain clocks generated by the ASMD circuits. The internal clock generator may include first through fourth ASMD circuits. The first ASMD circuit may generate a first clock in response to the signal output from the input buffer, the first clock rising a given first time earlier than a rising edge of an odd numbered cycle of the signal output from the input buffer. The second ASMD circuit may operate one cycle later than the first ASMD circuit and may generate a second clock in response to the signal output from the input buffer, the second clock generated one cycle later than the first clock. The third ASMD circuit may generate a third clock in response to a signal output from the inverter, the third clock rising a given second time earlier than a rising edge of an odd numbered cycle of the signal output from the inverter. The fourth ASMD circuit may operate one cycle later than the third ASMD circuit and may generate a fourth clock in response to the signal output from the inverter, the fourth clock generated one cycle later than the third clock. The edge detector may output an internal clock that rises at rising edges of the first and second clocks and falls at rising edges of the third and fourth clocks.

Another exemplary embodiment of the present invention is directed to an analog synchronous mirror delay (ASMD) circuit that may include a comparator with first and second input terminals that generates an output clock based on a comparison result between a signal on the first input terminal and a signal on the second input terminal, a first precharge circuit connected to the first input terminal and precharging the first input terminal, and a second precharge circuit connected to the second input terminal and precharging the second input terminal. The ASMD circuit may also include a first pair of discharge circuits discharging the first input terminal within first and second cycles of the input clock, and a second pair of discharge circuits discharging the second input terminal within first and second cycles of the input clock.

BRIEF DESCRIPTION OF THE DRAWINGS

Exemplary embodiments of the present invention will become more fully understood from the detailed description given hereinbelow and the accompanying drawings, wherein like elements are represented by like reference numerals, which are given by way of illustration only and thus are not limitative of exemplary embodiments the present invention and wherein.

DETAILED DESCRIPTION OF THE EXEMPLARY EMBODIMENTS

Where used herein, a "logic high" may refer to a logic state being in a high state or at a high level, with a subsequent duration of the logic state at the high level being referred to as a "high duration". The high duration may remain until the logic state changes to a low state or "logic low", with a subsequent duration being referred to as a "low duration", for example.

Figure 1:
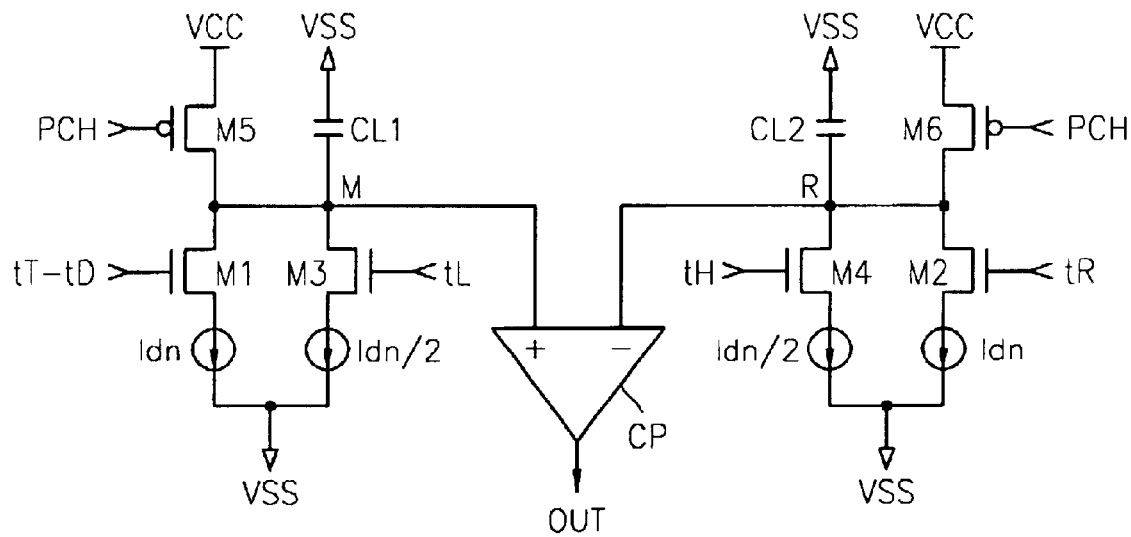
FIG. 1 is a circuit diagram of an analog synchronous mirror delay circuit with a duty cycle correction scheme, according to an exemplary embodiment of the present invention.
Figure 2:
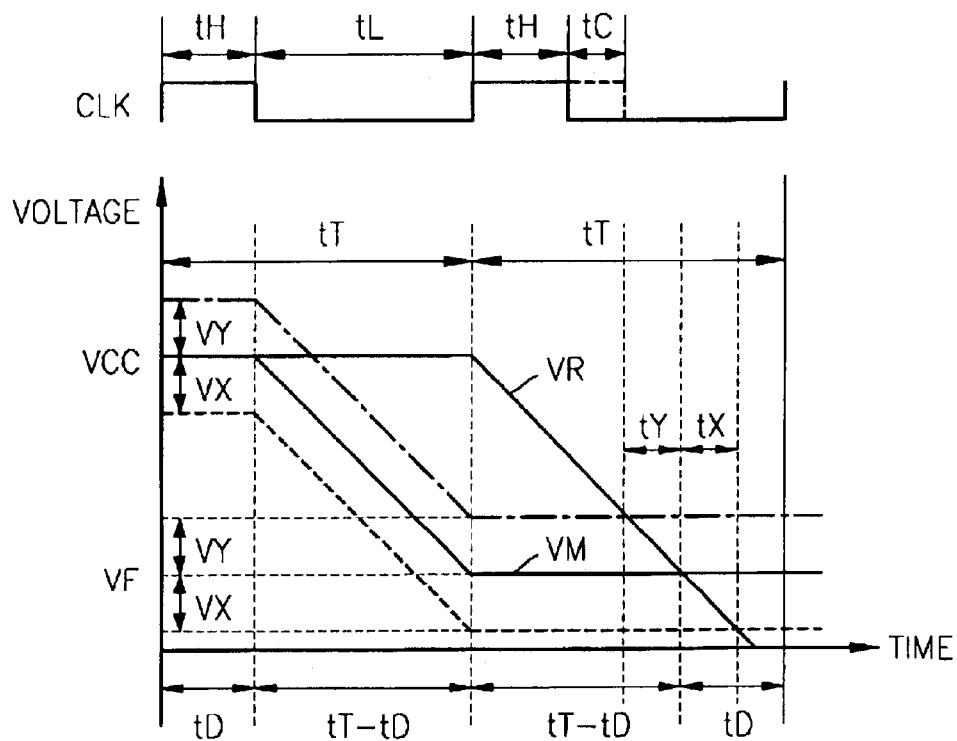
FIG. 2 is a timing diagram of the analog synchronous mirror delay circuit of FIG. 1.

FIG. 1 is a circuit diagram of an analog synchronous mirror delay circuit with a duty cycle correction scheme, (hereinafter, referred to as 'ASMDCC') according to an exemplary embodiment of the present invention. FIG. 2 is a timing diagram of the ASMDCC of FIG. 1.

In FIGS. 1 and 2, tT may denote a cycle period of an input clock ("CLK") that is input to the ASMDCC, i.e., a cycle time, tD may denote a target delay time for synchronizing an output clock ("OUT") with the input clock CLK, tH may denote a high duration (i.e., logic HIGH) of the input clock CLK, and tL may denote a low duration (i.e., logic LOW) of the input clock CLK.

Referring to FIG. 1, the ASMDCC may include a first precharge circuit M5, a second precharge circuit M6, a first discharge circuit M1, a second discharge circuit M2, a first additional discharge circuit M3, a second additional discharge circuit M4, a first capacitor CL1, a second capacitor CL2, and a comparator CP. Operation of the ASMDCC will be described in further detail later.

The first capacitor CL1 may be connected to a first input terminal M of the comparator CP and the second capacitor CL2 may be connected to a second input terminal R of the comparator CP. The comparator CP, which may be composed of a differential amplifier, compares signals output from the first input terminal M and the second input terminal R, and outputs an output clock OUT based on the comparison result.

The first precharge circuit M5 may be connected to the first input terminal M of the comparator CP and precharges the first input terminal M to a power source voltage level VCC in response to a precharge signal PCH. The second precharge circuit M6 may be connected to the second input terminal R of the comparator CP and precharges the second input terminal R to the power source voltage level VCC in response to the precharge signal PCH. The first precharge circuit M5 and the second precharge circuit M6 may be embodied as PMOS transistors, for example.

The first discharge circuit M1 may discharge the first input terminal M for a period tT−tD, which may correspond to a difference between a target delay time tD and a cycle period tT of the input clock, within a first cycle of the input clock CLK. The second discharge circuit M2 may discharge the second input terminal R for two cycles of the input clock CLK. The first and second discharge circuits M1 and M2 may be current sources, and may be embodied as NMOS transistors, for example. An amount of current (Idn) generated by the first discharge circuit M1 may be designed to be substantially equal or equal to that generated by the second discharge circuit M2. In FIG. 1, the period tT−tD also may denote a pulse signal applied to a gate of the first discharge circuit M1, such as a pulse signal that may be activated for the period tT−tD within the first cycle of the input clock CLK, for example. Signal tR denotes a pulse signal that may be applied to a gate of the second discharge circuit M2 and activated for two cycles of the input clock CLK.

Without the first and second additional discharge circuits M3 and M4, a voltage level VM of the first input terminal M may be maintained at a given voltage level VF, and the second input terminal R may be continuously discharged until a voltage level VR of the second input terminal R equals voltage level VF in the second cycle of the input clock CLK. Therefore, the voltage level VM of the first input terminal M meets (i.e., reaches) the voltage level VR of the second input terminal R before the target delay time tD from a rising edge of the input clock CLK in a third cycle of the input clock CLK. The output clock OUT, i.e., a signal output from the comparator CP is generated at an intersection of the voltage level VM and the voltage level VR. In FIG. 2, a horizontal, solid line denotes the voltage level VM when the length of the high duration tH of the input clock CLK is the same as that of the low duration tL of the input clock CLK.

When the length of the high duration tH of the input clock CLK is shorter than that of the low duration tL of the input clock CLK, the high duration tH should be changed to tH+tC in order to compensate for a duty cycle of the output clock OUT, for example, to obtain an output clock OUT of a 50% duty cycle. Here, tC=0.5*(tL−tH). That is, the duty cycle of the output clock CLK can be altered by adding tC to tH. To obtain tC, the ASMDCC according to the exemplary embodiments of the present invention may further include first and second additional discharge circuits M3 and M4, as shown in FIG. 1.

The first and second additional discharge circuits M3 and M4 may be current sources and may be embodied as NMOS transistors, for example. Each of the first and second additional discharge circuits M3 and M4 may be designed to generate an amount of current Idn/2, which is half the amount of current Idn generated by each of the first and second discharge circuits M1 and M2. Signal tL applied to a gate of the first additional discharge circuit M3 may be a pulse signal activated during a low duration of the input clock CLK, for example. Signal tH applied to a gate of the second additional discharge circuit M4 may be a pulse signal activated during a high duration of the input clock CLK, for example.

The first additional discharge circuit M3 may discharge the input terminal M for a certain low duration of the input clock CLK within a first or second cycle of the input clock CLK. The second additional discharge circuit M4 may discharge the second input terminal R for a certain high duration of the input clock CLK within the first or second cycle of the input clock CLK. After these discharges, a voltage difference VX between the first and second input terminals M and R may be expressed as follows:

$$VX = VR - VM = Idn*(tL-tH)/(2*CL) = K*tC \quad (1),$$

wherein a slope K=Idn/CL, tC=(tL−tH)/2, and CL represents a capacitance of the first or second capacitor, CL1 or CL2.

In FIG. 2, a horizontal, dotted line denotes the voltage level VM when the length of the high duration tH of the input clock CLK is shorter than that of the low duration tL of the input clock CLK. The voltage difference VX may equal a value obtained by discharging the first input terminal M with the current source Idn, for tC. Once the voltage difference VX is obtained, the first input terminal M may be discharged at slope K for the period tT−tD. Thus, in the second cycle of the input clock CLK, the voltage level VM of the first input terminal M is VF−VX, and the second input terminal R of the second input terminal CLK begins to be discharged. As a result, the voltage level VR meets the voltage level VF−FX after tT−tD+tX. Here, tX indicates the same time as tC. Thus, the intersection of the voltage levels VR and VM is pushed forward by tC, i.e., tX, thereby amending the duty cycle of the output clock OUT during the synchronization of the input clock CLK and the output clock OUT.

In FIG. 2, a horizontal, chain biased line denotes the voltage level VM when the length of the high duration tH is longer than that of the low duration tL. If the length of the high duration tH of the input clock CLK is longer than that of the low duration tL of the input clock CLK, the duty cycle of the output clock OUT can be also compensated for as described above in the preceding paragraph. Thus, an ASM-DCC according to the exemplary embodiments of the present invention may be advantageous in that locking may be done within two-clock cycles, and duty cycles of an output clock may be compensated to obtain an output clock OUT with a 50% duty cycle, for example.

Figure 3:
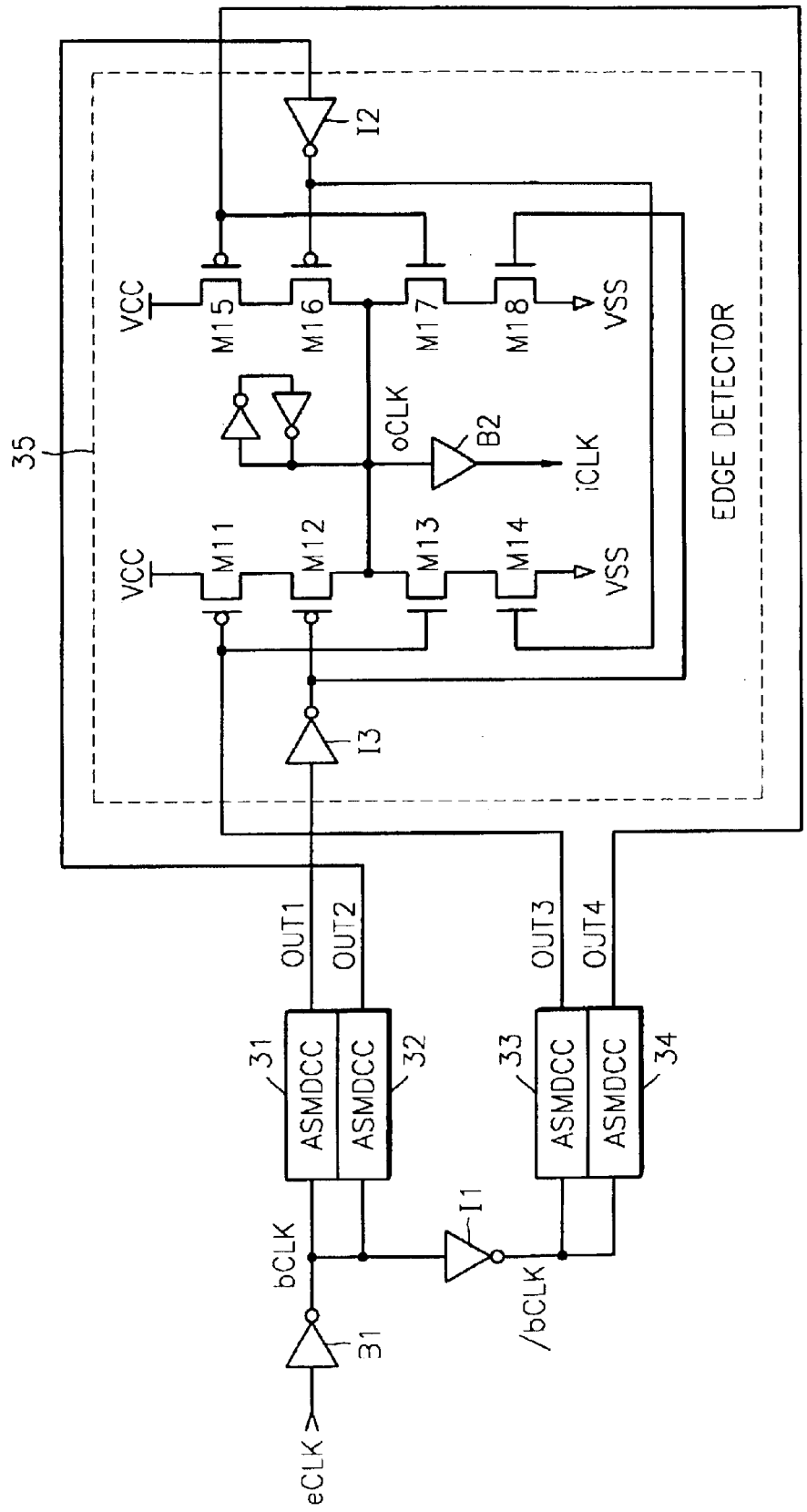
FIG. 3 is a circuit diagram of an internal clock generator, according to an exemplary embodiment of the present invention.
Figure 4:
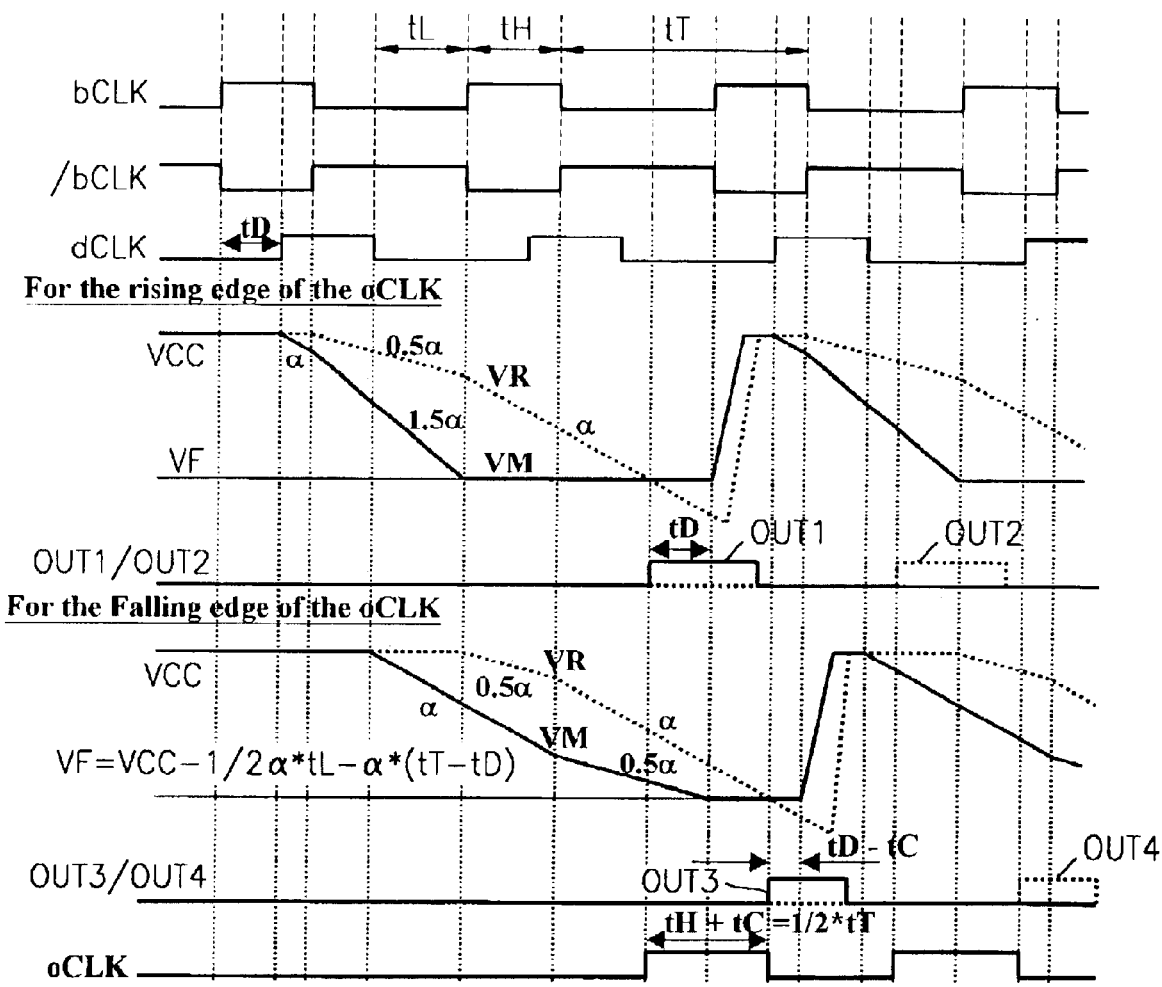
FIG. 4 is a timing diagram of the internal clock generator of FIG. 3.

FIG. 3 is a circuit diagram of an internal clock generator according to an exemplary embodiment of the present invention, and FIG. 4 is a timing diagram of the internal clock generator of FIG. 3. The circuit diagram in FIG. 1 employs the ASMDCC of FIG. 1.

Referring to FIG. 3, the internal clock generator 30 may includes an input buffer B1, an inverter I1, four ASMDCCs 31 through 34, and an edge detector 35, for example. The input buffer B1 buffers an externally applied clock eCLK, and the inverter I1 inverts a signal output from the input buffer B1, i.e., a buffered external clock bCLK. Internal clock generator 30 may employ the four ASMDCCs 31-34 to generate an internal clock iCLK with a 50% duty cycle, for example. The first and second ASMDCCs 31 and 32 may be used to determine a rising edge of an internal clock OCLK generated by first and second clocks OUT1 and OUT2, whereas the third and fourth ASMDCCs 33 and 34 may be used to determine a falling edge of the internal clock OCLK.

The first ASMDCC 31 may generate the first clock OUT1 in response to the buffered external clock bCLK. A rising edge of the first clock OUT1 may be generated a first time tD earlier than a rising edge of an odd numbered cycle of the external clock bCLK. The first time tD denotes a target delay time required to synchronize the internal clock iCLK with the external clock eCLK, corresponding to a delay d1+d2, where d1 denotes a delay time for the input buffer B1, and d2 denotes a delay time for a buffer B2 that generates the internal clock iCLK.

The second ASMDCC 32 operates one cycle later than the first ASMDCC 31 to generate the second clock OUT2, in response to the buffered external clock bCLK. The second clock OUT2 is one cycle slower than the first clock OUT1.

The third ASMDCC 33 generates a third clock OUT3 in response to a signal/bCLK output from the inverter 11. A rising edge of the third clock OUT3 is generated a second time tD−tC earlier than a rising edge of an odd numbered cycle of the external clock/bCLK of the inverter I1, wherein tC=0.5*(tL−tH). The fourth ASMDCC 34 operates one cycle later than the third ASMDCC 33 to generate a fourth clock OUT4 in response to the signal/bCLK output from the inverter 11. The fourth clock OUT4 is one cycle slower than the third clock OUT3.

The edge detector 35 outputs the internal clock oCLK that rises at rising edges of the first and second clocks OUT1 and OUT2 and falls at rising edges of the third and fourth clocks OUT3 and OUT4. The buffer B2 buffers the internal clock OCLK to generate the final internal clock iCLK.

The operation of an internal clock generator according to the exemplary embodiments of the present invention will now be described with reference to the timing diagram of FIG. 4. To secure a two-clock cycle locking time while synchronizing clocks, for example, the internal clock generator 30 detects a voltage difference VX to compensate for a duty cycle of an output clock, as illustrated in FIG. 3. The first clock OUT1, i.e., a signal output from the first ASM-DCC 31, is generated the first time tD earlier than a rising edge of the buffered output clock bCLK. To substantially reduce or prevent asymmetry between the four ASMDCCs 31–34, the first and second additional discharge circuits M3 and M4 may discharge voltage levels VM and VR of first and second input terminals of the first ASMDCC 31 for a low duration tL of the input clock eCLK, within a first cycle of the buffered external clock bCLK. In FIG. 4, VM is shown as a solid black line and VR as a dotted line. The second clock OUT2, which may be a signal output from the second ASMDCC 32, may be generated one cycle later than the first clock OUT1.

When the third ASMCC 33 generates the third clock OUT3, the voltage difference VX is detected simultaneously with synchronization of the clocks. For example, the voltage level VM is discharged for the period tT−tD through the first discharge circuit M1 in the first cycle of the external clock bCLK, and is discharged for tL through the first additional discharge cycle M3 in the second cycle of the external clock bCLK. As a result, the voltage level VM drops to reach a given voltage level VF for a subsequent cycle, as shown in FIG. 4.

The voltage level VR is discharged from a falling edge of the second cycle of the external clock bCLK and is simultaneously discharged through the second additional discharge circuit M4 for tH in the second cycle of the external cock bCLK. Thus, the voltage level VR meets the voltage level VM before td−tC from the falling edge of the external clock bCLK. That is, the third clock OUT3 is generated before tD−tC from the falling edge of the external clock bCLK. The fourth clock OUT4, i.e., a signal output from the fourth ASMDCC 34, is one cycle later than the third clock OUT3.

Therefore, a high duration of the internal clock OCLK, which is generated by the first and third clocks OUT1 and OUT3, is tH+tC. The internal clock oCLK is finally buffered by the buffer B2 to generate the final internal clock iCLK that has a 50% duty cycle and is in synchronization with the external clock eCLK within a two-clock cycle.

Exemplary embodiments of the invention being thus described, it will be obvious that the same may be varied in many ways. For example, the functional blocks in FIGS. 1 and 3 may be implemented with different circuit designs than what is shown. A clock generator in accordance with exemplary embodiments of the present invention may be configured using fewer than four ASMD circuits, for example. Such variations are not to be regarded as departure from the spirit and scope of the exemplary embodiments of the invention, and all such modifications as would be obvious to one skilled in the art are intended to be included within the scope of the following claims.

What is claimed is:

1. An analog synchronous mirror delay (ASMD) circuit, comprising:
   a comparator with first and second input terminals end generating an output clock based on a comparison result between a signal on the first input terminal and a signal on the second input terminal;
   a first precharge circuit connected to the first input terminal and precharging the first input terminal;
   a second precharge circuit connected to the second input terminal and precharging the second input terminal;
   a first discharge circuit discharging the first input terminal for a given period within a first cycle of an input clock;
   a first additional discharge circuit discharging the first input terminal for a first logic-state period of the input clock within first and second cycles of the input clock;
   a second discharge circuit discharge the second input terminal for the second cycle of the input clock; and
   a second additional discharge circuit discharging the second input terminal for a second logic-state period of the input clock within the first and second cycles of the input clock.

2. The circuit of claim 1, wherein the given period is obtained by subtracting a target delay time from a period of the input clock.

3. The circuit of claim 1, wherein the first logic state is logic low or logic high.

4. The circuit of claim 1, wherein the second logic state is logic low or logic high.

5. The circuit of claim 1, further comprising:
   a first capacitor connected to the first input terminal; and
   a second capacitor connected to the second input terminal.

6. The circuit of claim 1, wherein current generated by the first discharge circuit equals current generated by the second discharge circuit.

7. The circuit of claim 1, wherein current generated by the first additional discharge circuit equals current generated by the second additional discharge circuit.

8. The circuit of claim 1, wherein current generated by the first additional discharge circuit is half a current generated by the first discharge circuit.

9. The circuit of claim 1, wherein current generated by the second additional discharge circuit is halt a current generated by the second discharge circuit.

10. The circuit of claim 1, wherein the first precharge circuit includes a PMOS transistor having a source, gate and drain, with a power source voltage applied to the source, a precharge signal applied to the gate and the drain connected to the first input terminal.

11. The circuit of claim 1, wherein the second precharge circuit includes a PMOS transistor having a source, gate and drain, with a power source voltage applied to the source, a precharge signal applied to the gate and the drain connected to the second input terminal.

12. The circuit of claim 1, wherein the first discharge circuit includes an NMOS transistor having a source, gate and drain, with a ground voltage applied to the source, a pulse signal applied to the gate and the drain connected to the first input terminal, the pulse signal activated for the given period.

13. The circuit of claim 1, wherein the first additional discharge circuit includes an NMOS transistor having a source, gate and drain, with a ground voltage applied to the source, a pulse signal applied to the gate and the drain connected to the first input terminal, the pulse signal activated for the first logic-state period.

14. The circuit of claim 1, wherein the second discharge circuit includes on NMOS transistor having source, gate and drain, with a ground voltage applied to the source, a pulse signal applied to the gate and the drain connected to the second input terminal, the pulse signal activated for the second cycle.

15. The circuit claim 1, wherein the second additional discharge circuit includes an NMOS transistor having a source, gate and drain, with a ground voltage applied to the source, a pulse signal applied to the gate and the drain connected to the second input terminal, the pulse signal activated for the second logic-state period.

16. The circuit of claim 1, wherein the comparator is embodied as a differential amplifier.

17. The circuit of claim 1, wherein the first and second precharge circuits precharge the first and second input terminals in response to a precharge signal.

18. The circuit of claim 1, wherein the first logic state period and the second logic state period are within the first and second cycles of the input clock.

19. A method of generating a clock, comprises:
   (a) precharging a first node and a second node;
   (b) discharging the first node for a given period of time within a first cycle of an input clock;
   (c) discharging the first node for a given first logic-state period of the input clock;
   (d) discharging the second node for a second cycle of the input clock;
   (e) discharging the second node for a given second logic-state period of the input clock;
   (f) comparing a signal output from the first node with a signal output from the second node; and
   (g) outputting an output clock based on a result of (f).

20. The method of claim 19, wherein the given period is obtained by subtracting a target delay time from a period of the input clock.

21. The method of claim 19, wherein the target logic state is logic low or logic high.

22. The method of claim 19, wherein the second logic state is logic low or logic high.

23. The method of claim 19, wherein an amount of a discharge current in (b) equals an amount of a discharge current in (d).

24. The method of claim 19, wherein an amount of discharge current in (c) equals an amount of a discharge current in (e).

25. The method of claim 19, wherein an amount of discharge current in (c) is half an amount of discharge current in (b).

26. The method of claim 19, wherein an amount of discharge current in (e) is half an amount of discharge current in (d).

27. The method of claim 19, wherein the first logic state period and the second logic state period are within the first and second cycles of the input clock.

28. An analog synchronous mirror delay (ASMD) circuit, comprising:
- a comparator with first and second input terminals and generating an output clock based on a comparison result between a signal on the first input terminal and a signal on the second input terminal;
- a first precharge circuit connected to the first input terminal and precharging the first input terminal;
- a second precharge circuit connected to the second input terminal and precharging the second input terminal;
- a first pair of discharge circuits discharging the first input terminal within first and second cycles of the input clock; and
- a second pair of discharge circuits discharging the second input terminal within first and second cycles of the input clock.

29. The circuit of claim 28, wherein one discharge circuit of the first pair discharges the first input terminal for a given period in the first cycle of the input clock.

30. The circuit of claim 29, wherein one discharge circuit of the first pair discharges the first input terminal for a first logic-state period of the input clock within the first and second cycles.

31. The circuit of claim 28, wherein one discharge circuit of the second pair discharge the second input terminal for the second cycle of the input clock.

32. The circuit of claim 31, wherein one discharge circuit of the second pair discharges the second input terminal for a second logic-state period of the input clock within the first and second cycles.

33. An internal clock generator including one of more analog synchronous mirror delay (ASMD) circuits as defined in claim 1.

* * * * *